(12) United States Patent
Lin et al.

(10) Patent No.: US 8,797,194 B2
(45) Date of Patent: Aug. 5, 2014

(54) PHASE-BASED ANALOG-TO-DIGITAL CONVERSION

(71) Applicant: The Ohio State University, Columbus, OH (US)

(72) Inventors: Yiqiao Lin, Columbus, OH (US); Mohammed Ismail El-nagger, Dublin, OH (US)

(73) Assignee: The Ohio State University, Columbus, OH (US)

( * ) Notice: Subject to any disclaimer, the term of this patent is extended or adjusted under 35 U.S.C. 154(b) by 0 days.

(21) Appl. No.: 13/922,927

(22) Filed: Jun. 20, 2013

(65) Prior Publication Data

US 2013/0342377 A1    Dec. 26, 2013

Related U.S. Application Data

(60) Provisional application No. 61/662,059, filed on Jun. 20, 2012.

(51) Int. Cl.
*H03M 1/48* (2006.01)
*H03M 1/12* (2006.01)

(52) U.S. Cl.
CPC ..................................... *H03M 1/12* (2013.01)
USPC ........................... 341/111; 341/143; 341/155

(58) Field of Classification Search
CPC ......................................................... H03M 1/12
USPC ......................................... 341/155, 143, 111
See application file for complete search history.

(56) References Cited

U.S. PATENT DOCUMENTS

| | | | |
|---|---|---|---|
| 6,480,126 B1 * | 11/2002 | Chu | 341/111 |
| 6,952,175 B2 * | 10/2005 | Chu et al. | 341/111 |
| 2005/0062624 A1 * | 3/2005 | Chu et al. | 341/111 |

* cited by examiner

*Primary Examiner* — Jean B Jeanglaude
(74) *Attorney, Agent, or Firm* — Tarolli, Sundheim, Covell & Tummino LLP

(57) ABSTRACT

One embodiment includes a phase-based analog-to-digital converter (ADC) system. The system includes a voltage-to-phase converter configured to convert an input voltage to a phase difference corresponding to a phase-delay with respect to an input clock signal that is based on a magnitude of the input voltage. The system also includes a phase-to-digital converter configured to convert the phase difference into a digital output signal having a digital value corresponding to a magnitude of the phase difference.

20 Claims, 3 Drawing Sheets

PHASE-BASED ANALOG-TO-DIGITAL CONVERSION

RELATED APPLICATION

This application claims the benefit of U.S. Provisional Patent Application Ser. No. 61/662,059, filed 20 Jun. 2012 and entitled TIME-BASED ALL DIGITAL SIGMA-DELTA MODULATORS FOR NANOMETER LOW VOLTAGE CMOS DATA APPLICATIONS, which is incorporated herein by reference in its entirety.

TECHNICAL FIELD

This disclosure relates generally to electronic systems, and more specifically to phase-based analog-to-digital conversion.

BACKGROUND

Analog-to-digital conversion is implemented in a variety of computer and communications applications. A variety of different types of analog-to-digital converters (ADCs) have been developed to convert an analog signal, such as voltage, to a digital signal having a value that corresponds to the magnitude of the analog signal. One approach to provide analog-to-digital conversion includes quantizing instantaneous amplitudes of the analog signal at a sampling rate that is at least a Nyquist rate corresponding to a minimum sampling frequency. As an example, delta-sigma modulators can often be implemented as ADCs, such as for time-based analog-to-digital conversion. Delta-sigma modulation ADCs can thus provide a more resolute digital output from the analog input, such as based on implementing feedback to the input analog signal.

SUMMARY

One example relates to a phase-based analog-to-digital converter (ADC) system. The system includes a voltage-to-phase converter configured to convert an input voltage to a phase signal corresponding to a phase difference with respect to an input clock signal and based on a magnitude of the input voltage. The system also includes a phase-to-digital converter configured to convert the phase signal into a digital output signal having a digital value corresponding to a magnitude of the phase difference.

Another example relates to a method for converting an analog signal to a digital signal. The method includes receiving the analog signal as an input voltage and converting the input voltage to a phase-delay clock signal having a phase delay relative to an input clock signal that is proportional to a magnitude of the input voltage. The method also includes digitally quantizing the phase delay of the phase-delay clock signal relative to the input clock signal. The method further includes providing the digital quantization of the phase delay of the phase-delay clock signal relative to the input clock signal as a digital output signal.

Another example relates to a phase-based delta-sigma modulation ADC system that is configured to convert an input voltage to a digital output signal. The system includes a loop filter configured to filter a summation voltage to generate a control voltage. The system also includes a voltage-to-phase converter configured to convert the control voltage to a phase signal corresponding to a phase difference with respect to an input clock signal and that is based on a magnitude of the summation voltage. The system also includes a phase-to-digital converter configured to convert the phase signal into a digital output signal having a digital value corresponding to a magnitude of the phase difference. The system further includes a feedback path configured to convert the digital output signal to a feedback voltage that is integrated with the input voltage to generate the summation voltage.

DETAILED DESCRIPTION

Figure 1:
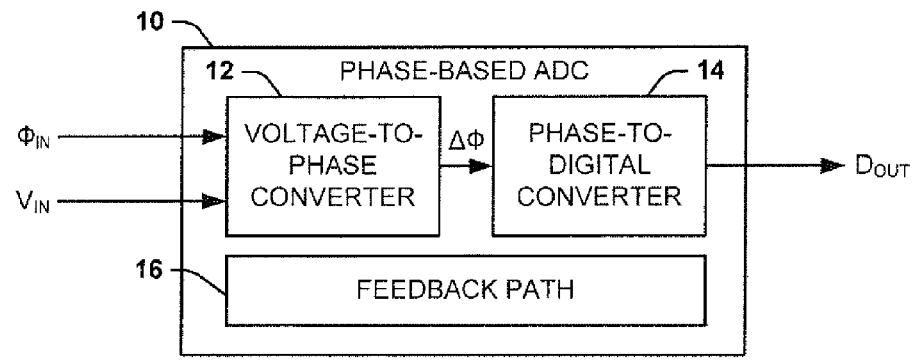
FIG. 1 illustrates an example of a phase-based analog-to-digital (ADC) system.

This disclosure relates generally to electronic systems, and more particularly to phase-based analog-to-digital converter (ADC) systems. The phase-based ADC can be implemented for converting an input voltage to a digital output based on converting the input voltage to a phase-delay associated with an input clock signal, and can convert the phase-delay to the corresponding digital output signal. The phase-based ADC system can include a voltage-to-phase converter. For example, the voltage-to-phase converter can include a voltage-controlled delay line that is powered by the input voltage to generate a phase signal having a phase that is proportional to the input voltage. As one example, the phase signal can be provided to a phase-detector that can generate a signal pulse having a pulse-width that is associated with the phase of the phase signal relative to the input clock signal. As another example, the phase signal can be generated as the output of a last of a plurality of series-connected delay elements, such as inverters, and each of the delay elements can generate respective delay signals.

The phase-based ADC system can also include a phase-to-digital converter that is configured to convert the phase signal into a digital output signal. The digital output signal can be, for example, a single-bit data stream having a time quantization corresponding to the phase-delay, and thus the input voltage. As another example, the digital output signal can be a multi-bit digital signal having a value corresponding to the phase, and thus the input voltage. The phase-to-digital converter can include a flip-flop (e.g., a D flip-flop or other clocked sequential logic structure) that is triggered by the input clock signal to provide the time quantization of the signal pulse corresponding to the phase-delay to provide the digital output signal as the single-bit data stream. As another example, the phase-to-digital converter can include a plurality of flip-flops (e.g., D flip-flops or similar circuitry) that each provide a data stream quantization of one of the respective delay signals provided by a given delay element. The data streams can be provided to a decoder in the phase-to-digital converter to provide the digital output signal as the multi-bit digital signal.

Additionally, the phase-based ADC can be configured as a delta-sigma modulator ADC that includes a feedback path to convert the digital output signal to a feedback voltage and employs a high sampling frequency. The feedback voltage can be integrated with the input voltage, with the resulting summation voltage being converted to the digital signal. As an example, the feedback path can be configured as a charge pump to provide the feedback voltage, such as based on the digital output signal being provided as the single-bit data stream. As another example, the feedback path can include a digital delay line comprising a plurality of capacitive delay elements that are respectively controlled based on respective bits of the digital output signal to provide a phase signal that has a phase-delay with respect to a reference clock signal. A phase-detector can detect the phase of the phase signal to generate the feedback voltage. Thus, the feedback voltage can be integrated with the input voltage to provide for a more granular analog-to-digital conversion.

FIG. 1 illustrates an example of a phase-based ADC system 10. The phase-based ADC system 10 can be implemented in any of a variety of applications for converting an analog signal to a digital signal, such as computing and/or communications applications. In the example of FIG. 1, the phase-based ADC system 10 is demonstrated as converting an input voltage $V_{IN}$ into a digital output signal $D_{OUT}$. The analog signal is not limited to being provided as an input voltage, however, and any of a variety of analog signal types can be converted to a digital representation.

The phase-based ADC 10 includes a voltage-to-phase converter 12 and a phase-to-digital converter 14. The voltage-to-phase converter 12 is configured to convert the input voltage $V_{IN}$ to a corresponding a phase based on an input clock signal $\Phi_{IN}$, which phase is demonstrated in the example of FIG. 1 as $\Delta\Phi$. The phase $\Delta\Phi$ can be provided as a signal representing a relative phase difference relative to the input clock signal $\Phi_{IN}$ that is proportional to the magnitude of the input voltage $V_{IN}$. As an example, the phase $\Delta\Phi$ can be provided as a signal pulse shifted by a phase-delay relative to the phase of the input clock signal $\Phi_{IN}$. The amount of phase shift (e.g., the phase-delay) implemented through the voltage-to-phase converter 12 can be proportional to the input voltage $V_{IN}$. As another example, the phase $\Delta\Phi$ can correspond to a plurality of phase-shifted signals that are each generated by a respective one of a plurality of delay elements, with the last of the phase-delay signals providing the output phase signal exhibiting an amount of phase-delay relative to the input clock signal $\Phi_{IN}$ that is proportional to the input voltage $V_{IN}$.

The phase-to-digital converter 14 is configured to quantize the phase-delay $\Delta\Phi$ to generate the digital output signal $D_{OUT}$ having a digital value that corresponds to the magnitude of the input voltage $V_{IN}$. As an example, the phase-to-digital converter 14 can include a flip-flop (e.g., a D flip-flop) that is triggered by the input clock signal $\Phi_{IN}$ to quantize the phase $\Delta\Phi$ into a single-bit digital data stream. The phase $\Delta\Phi$ can thus have a digital duration that corresponds to the phase $\Delta\Phi$, and thus the input voltage $V_{IN}$. As another example, the phase-to-digital converter 14 can include a plurality of flip-flops that are triggered by the phase-delayed clock signal to each provide a digital data stream of the respective phase-delay signals. The digital data streams can thus be provided to a decoder that is configured to generate the digital output signal $D_{OUT}$ based on the digital data streams.

In addition, the phase-based ADC system 10 can be configured as a delta-sigma or sigma-delta modulation ADC. Thus, in the example of FIG. 1, the phase-based ADC system 10 includes a feedback path 16 and employs a high sampling frequency. For example, the sample rate (e.g., provided by the sampling clock) can be an oversampling rate of 50 times or more (e.g., about 64 or higher). The feedback path 16 can be configured to generate a feedback voltage based on the digital output signal $D_{OUT}$. As an example, the feedback voltage can be integrated with the input voltage $V_{IN}$, such that the voltage-to-phase converter 12 generates the phase $\Delta\Phi$ based on a summation voltage that is representative of the integration of the input voltage $V_{IN}$ with the feedback voltage. For example, the feedback path 16 can be configured as a charge-pump to provide the feedback voltage based on the digital output signal $D_{OUT}$ being provided as a single-bit data stream. As another example, the feedback path 16 can include a digital delay line that can provide a phase-delayed reference clock signal, such as corresponding to the digital value of the digital output signal $D_{OUT}$, and can generate the feedback voltage based on a phase-difference between the phase delayed reference clock signal and the reference clock signal itself. Accordingly, the phase-based ADC system 10 can provide a more accurate and/or resolute digital output signal $D_{OUT}$ based on the delta-sigma modulation.

By utilizing phase as an intermediate parameter for implementing analog-to-digital conversion, the phase-based ADC system 10 can provide substantially accurate digital conversion without being compromised by substantially limited voltage signal ranges that are becoming more increasingly limited in typical embedded low voltage devices. In addition, the phase-based conversion with respect to quantization and feedback in the phase domain can result in reference jitter and quantization noise shaping based on the highly linear digital-phase-voltage feedback that can be implemented in the feedback path, while still achieving substantially low power due to the digital quantization. Accordingly, the phase-based ADC system 10 can be effectively implemented in low-power, nano-scale device designs.

Figure 2:
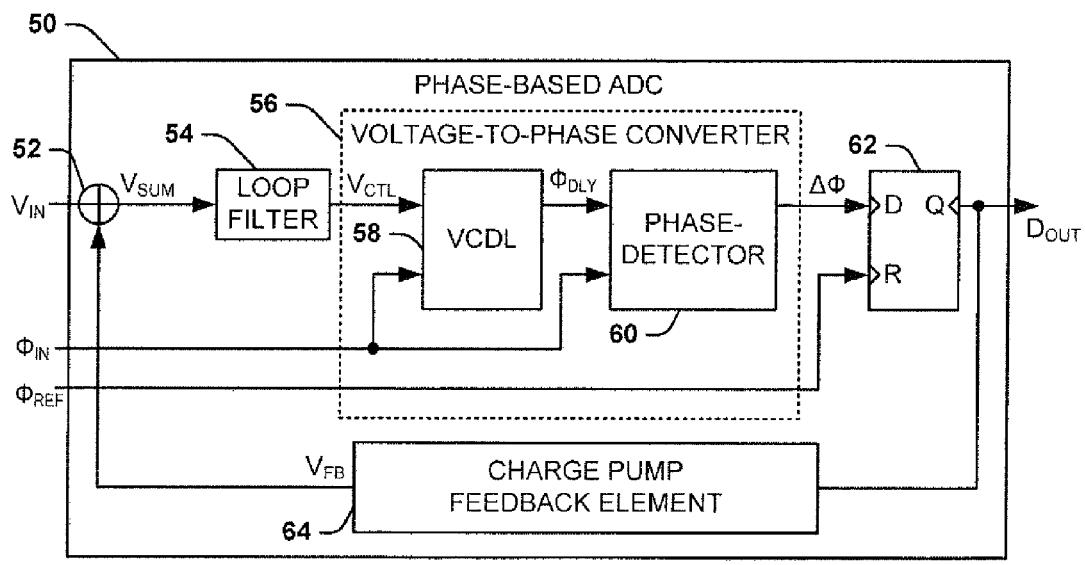
FIG. 2 illustrates another example of a phase-based ADC system.

FIG. 2 illustrates another example of a phase-based ADC system 50. The phase-based ADC system 50 can correspond to the phase-based ADC system 10 in the example of FIG. 1 to generate the digital output signal $D_{OUT}$ as a single-bit data stream corresponding to the input voltage $V_{IN}$. In the example of FIG. 2, the phase-based ADC system 50 is configured as a delta-sigma modulation phase-based ADC system. However, it is to be understood that the phase-based ADC system 50 is not limited to providing delta-sigma modulation, but could instead provide analog-to-digital conversion without implementing feedback and input integration, as described herein.

The phase-based ADC system 50 includes an integration element 52 that is configured to receive the input voltage $V_{IN}$ and to provide a summation voltage $V_{SUM}$. The integration element 52 can be a summation element, for example. The summation voltage $V_{SUM}$ can correspond to an integration voltage of the input voltage $V_{IN}$ with a feedback voltage $V_{FB}$, as described herein. The summation voltage $V_{SUM}$ is provided to a loop filter 54 that is configured to filter the summation voltage to generate a control voltage $V_{CTL}$.

The phase-based ADC system 50 includes a voltage-to-phase converter 56 that receives the control voltage $V_{CTL}$ and an input clock signal $\Phi_{IN}$. As an example, the input clock signal $\Phi_{IN}$ can have a frequency that is at least the Nyquist rate, such as at a desired oversampling frequency (e.g., an oversampling rate of 50 or greater, such as about 64 or 128). The voltage-to-phase converter 56 is configured to implement a phase of the input clock signal $\Phi_{IN}$, which is demonstrated in the example of FIG. 2 as $\Delta\Phi$, and which can represent a phase value (e.g., a phase shifted version of the input clock signal $\Phi_{IN}$) that is proportional to the magnitude of the control voltage $V_{CTL}$. The voltage-to-phase converter 56 includes a voltage-controlled delay line (VCDL) 58 and a phase-detector 60. The VCDL 58 can be configured as a plurality of series-connected delay elements that are powered by the control voltage $V_{CTL}$. As an example, the series-connected delay elements can each be configured as inverters that each has the control voltage $V_{CTL}$ being provided as a supply voltage.

Therefore, the amount of gain, and thus the amount of delay, of each of the delay elements can be proportional to the magnitude of the control voltage $V_{CTL}$.

The input clock signal $\Phi_{IN}$ is provided as an input to the VCDL 58, such as an input of a first of the series-connected delay elements of the VCDL 58. The VCDL 58 can thus generate a phase-delayed clock signal $\Phi_{DLY}$ that is phase-shifted relative to the input clock signal $\Phi_{IN}$ based on an amount of delay set by the magnitude of the control voltage $V_{CTL}$. The phase-delayed clock signal $\Phi_{DLY}$ and the input clock signal $\Phi_{IN}$ are each provided to the phase-detector 60, which is configured to calculate a phase-difference between the phase-delayed clock signal $\Phi_{DLY}$ and the input clock signal $\Phi_{IN}$. The phase-detector 60 is thus configured to generate a phase-delay signal $\Delta\Phi$ corresponding to the phase-difference between the phase-delayed clock signal $\Phi_{DLY}$ and the input clock signal $\Phi_{IN}$. As an example, the phase signal $\Delta\Phi$ can be provided as a signal pulse having a pulse-width that is approximately equal to the phase-difference between the phase-delayed clock signal $\Phi_{DLY}$ and the input clock signal $\Phi_{IN}$.

The phase-based ADC system 50 also includes a flip-flop 62, demonstrated in the example of FIG. 2 as a D flip-flop. The flip-flop 62 can correspond to the phase-to-digital converter 14 in the example of FIG. 1. The phase signal $\Delta\Phi$ is provided to the "D" input of the flip-flop 62, and a reference clock signal $\Phi_{REF}$ is provided to an "R" input (i.e., reset input) of the flip-flop 62, which thus triggers the flip-flop 62. Therefore, the flip-flop 62 can be configured to sample the phase signal $\Delta\Phi$ at the frequency of the reference clock signal $\Phi_{REF}$. As an example, the reference clock signal $\Phi_{REF}$ can have a frequency corresponding to a desired oversampling rate, such as disclosed herein. The output "Q" of the flip-flop 62 is thus configured to provide the digital output signal $D_{OUT}$ as a single-bit data stream. Therefore, the digital output signal $D_{OUT}$ is a time-quantization of the pulse-width of the phase signal $\Delta\Phi$.

In the example of FIG. 2, the phase-based ADC system 50 also includes a charge-pump feedback element 64 that can correspond to the feedback path 16 in the example of FIG. 1. The charge-pump feedback element 64 is configured to generate the feedback voltage $V_{FB}$ based on the digital output signal $D_{OUT}$. As an example, the charge-pump feedback element 64 can be implemented as a pull-up current source and a pull-down switch based on the digital bit value of a given bit in the single-bit digital data stream of the digital output signal $D_{OUT}$. For example, the charge-pump feedback element 64 can be configured to provide incremental changes to the feedback voltage $V_{FB}$ based on the single-bit data stream of the digital output signal $D_{OUT}$. The feedback voltage $V_{FB}$ can thus be integrated with the input voltage $V_{IN}$ to substantially reduce quantization error and jitter associated with the input clock signal $\Phi_{IN}$ and/or the reference clock signal $\Phi_{REF}$. In addition, implementing the charge-pump feedback element 64 in the delta-sigma modulation of the phase-based ADC system 50 provides for a very efficient feedback scheme based on the pull-up/pull-down configuration.

Figure 3:
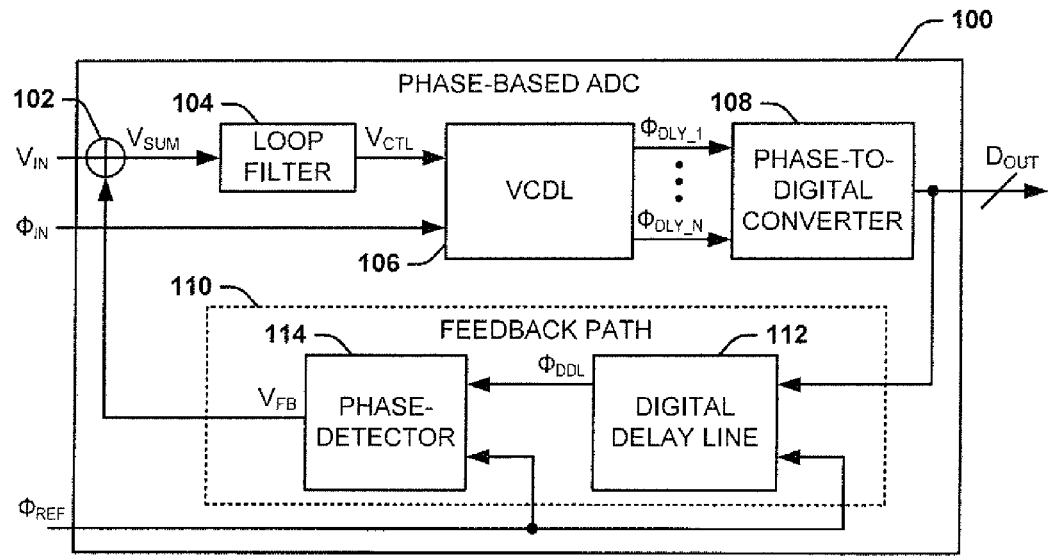
FIG. 3 illustrates yet another example of a phase-based ADC system.

FIG. 3 illustrates yet another example of a phase-based ADC system 100. The phase-based ADC system 100 can correspond to the phase-based ADC system 10 in the example of FIG. 1 to generate the digital output signal $D_{OUT}$ as a multi-bit data signal corresponding to the input voltage $V_{IN}$. In the example of FIG. 3, the phase-based ADC system 100 is configured as a delta-sigma modulation phase-based ADC system. However, it is to be understood that the phase-based ADC system 100 is not limited to providing delta-sigma modulation, but could instead provide analog-to-digital conversion without implementing feedback and input integration, as described herein.

The phase-based ADC system 100 includes an integration element 102 that is configured to receive the input voltage $V_{IN}$ and to provide a summation voltage $V_{SUM}$. The integration element can be a summation element, for example. The summation voltage $V_{SUM}$ can correspond to an integration voltage of the input voltage $V_{IN}$ with a feedback voltage $V_{FB}$, as described herein. The summation voltage $V_{SUM}$ is provided to a loop filter 104 that is configured to filter the summation voltage to generate a control voltage $V_{CTL}$.

The phase-based ADC system 100 includes a VCDL 106 and a phase-to-digital converter 108. The VCDL 106 can correspond to the voltage-to-phase converter 12 in the example of FIG. 1, and thus receives the control voltage $V_{CTL}$ and an input clock signal $\Phi_{IN}$ as respective inputs. As an example, the input clock signal $\Phi_{IN}$ can have a frequency that is at least the Nyquist rate, such as at a desired oversampling frequency. The VCDL 106 can be configured as a plurality of series-connected delay elements that are powered by the control voltage $V_{CTL}$. As an example, the series-connected delay elements can each be configured as inverters that each have the control voltage $V_{CTL}$ being provided as a supply voltage. Therefore, the amount of gain, and thus the amount of delay, of each of the delay elements can be proportional to the magnitude of the control voltage $V_{CTL}$.

The VCDL 106 is configured to provide a plurality N of phase-delay signals associated with the input clock signal $\Phi_{IN}$, which are demonstrated in the example of FIG. 3 as $\Phi_{DLY\_1}$ through $\Phi_{DLY\_N}$, where N is positive integer. Each of the phase signals $\Phi_{DLY\_1}$ through $\Phi_{DLY\_N}$ can be generated by respective series-connected delay elements in the VCDL 106, and can thus represent respective increasing amounts of phase-delay of the input clock signal $\Phi_{IN}$. Therefore, "N" can represent a quantity of the series-connected delay elements. The input clock signal $\Phi_{IN}$ is provided as an input to the VCDL 106, such as an input of a first of the series-connected delay elements of the VCDL 106. Therefore, a last of the series-connected delay elements (i.e., the $N^{th}$ of the series-connected delay element) can thus provide the phase-delay signal $\Phi_{DLY\_N}$ as the phase-delayed clock signal that is representative of a phase-delay of the input clock signal ON that is proportional to the magnitude of the control voltage $V_{CTL}$.

The phase-delay signals $\Phi_{DLY\_1}$ through $\Phi_{DLY\_N}$ and the input clock signal $\Phi_{IN}$ are provided to the phase-to-digital converter 108, which is configured to generate the digital output signal $D_{OUT}$ as a multi-bit digital signal. As an example, the phase-to-digital converter 108 can include a plurality of flip-flops that each receive one of the phase-delay signals $\Phi_{DLY\_1}$ through $\Phi_{DLY\_N}$ as an input and are each triggered by the phase-delayed clock signal (e.g., the phase-delay signal $\Phi_{DLY\_N}$) to provide a single-bit data stream to a decoder. Therefore, the decoder can generate the multi-bit digital output signal $D_{OUT}$ based on the respective single-bit digital data streams.

Figure 4:
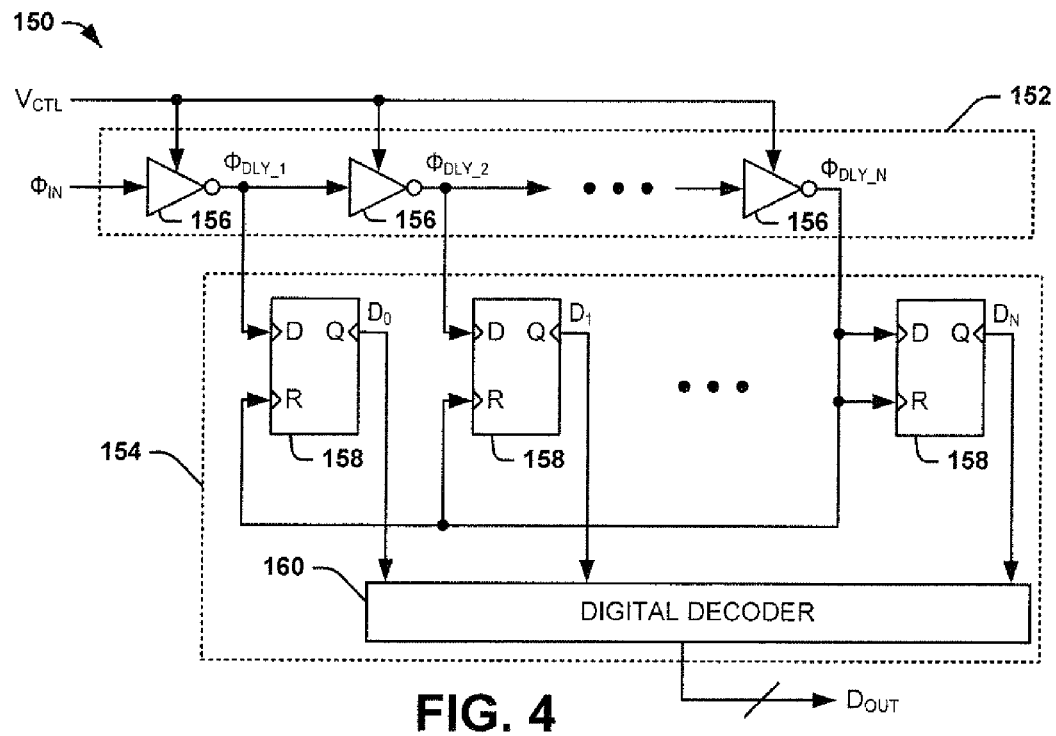
FIG. 4 illustrates yet a further example of a phase-based ADC system.

FIG. 4 illustrates an example of a phase-based ADC system 150. The phase-based ADC system 150 includes a voltage-to-phase converter 152 and a phase-to-digital converter 154 that can be correspond, respectively, to the VCDL 106 and the phase-to-digital converter 108 in the example of FIG. 3. Therefore, reference is to be made to the example of FIG. 3 in the following description of the example of FIG. 4.

The voltage-to-phase converter 152 is configured in the example of FIG. 4 as a VCDL that includes a plurality N of series-connected inverters 156, where N is a positive integer. As an example, each of the series-connected inverters 156 can be fabricated substantially the same, such as matched components on a given wafer. Each of the series-connected inverters 156 is powered by the control voltage $V_{CTL}$, and thus exhibits an associated gain and operational speed that is based on the magnitude of the control voltage $V_{CTL}$. A first of the inverters 156 is provided the input clock signal $\Phi_{IN}$ as an input, and each of the inverters 156 is configured to provide a respective one of the phase-delay signals $\Phi_{DLY\_1}$ through $\Phi_{DLY\_N}$. Each of the phase-delay signals $\Phi_{DLY\_1}$ through $\Phi_{DLY\_N}$ thus represents an incrementally phase-shifted version of the input clock signal $\Phi_{IN}$. The last of the inverters 156 generates the $N^{th}$ and most phase-delayed version of the input clock signal Dm, which thus corresponds to the phase-delayed clock signal that is representative of a phase-delay of the input clock signal $\Phi_{IN}$ that is proportional to the magnitude of the control voltage $V_{CTL}$. As an example, the amount of delay of each of the series-connected inverters 156 can be expressed as follows:

$$\Phi_{DLY\_Z} = \Phi_{IN} + Z*T_{INV} + Z*K_V*V_{CTL} \qquad \text{Equation 1}$$

Where: Z corresponds to one of the N inverters 156 for which the respective delay signal is calculated;
$T_{INV}$ corresponds to a nominal delay of the inverters 156; and
$K_V$ corresponds to a gain of the inverters 156.

The phase-to-digital converter 154 includes a plurality of flip-flops 158, demonstrated in the example of FIG. 4 as D flip-flops. The phase-delay signals $\Phi_{DLY\_1}$ through $\Phi_{DLY\_N}$ are each provided to a "D" input of a respective one of the flip-flops 158. In addition, the phase-delay clock signal $\Phi_{DLY\_N}$ is provided at the output of the last of the series-connected inverters 156 is provided to an "R" input of each of the flip-flops 158. Therefore, the phase-delay clock signal $\Phi_{DLY\_N}$ triggers each of the flip-flops 158. Accordingly, each of the flip-flops 158 samples the respective one of the phase-delay signals $\Phi_{DLY\_1}$ through $\Phi_{DLY\_N}$ at the frequency of the phase-delay clock signal $\Phi_{DLY\_N}$ to generate respective single-bit data streams $D_0$ through $D_N$ at respective "Q" outputs. However, the flip-flops 158 do not start to sample the phase-delay signals $\Phi_{DLY\_1}$ through $\Phi_{DLY\_N}$ until the full phase-delay of the input clock signal $\Phi_{IN}$, as provided by the magnitude of the control voltage $V_{CTL}$. Therefore, the phase-delay clock signal $\Phi_{DLY\_N}$ provides dynamic sampling of the phase-delay signals $\Phi_{DLY\_1}$ through $\Phi_{DLY\_N}$ that is based on the phase-delay of the phase-delay clock signal $\Phi_{DLY\_N}$ relative to the input clock signal $\Phi_{IN}$. Accordingly, the fixed delay of the VCDL arrangement of the voltage-to-phase converter 152 is substantially canceled.

The respective single-bit data streams $D_0$ through $D_N$ generated by each of the flip-flops 158 is thus provided to a digital decoder 160. The digital decoder 160 is configured to generate the digital output signal $D_{OUT}$ as a multi-bit digital signal. The digital decoder 160 can provide the digital output signal $D_{OUT}$ as having a number of bits L based on a desired resolution of the digital output signal $D_{OUT}$ and based on the number N of the series-connected inverters 156 in the voltage-to-phase converter 152. For example, the number of bits L of the digital output signal $D_{OUT}$ can be expressed as follows:

$$L = \log_2 * N + 1 \qquad \text{Equation 2}$$

Referring back to the example of FIG. 3, the phase-based ADC system 100 also includes a feedback path 110. The feedback path 110 includes a digital delay line (e.g., digitally-controlled delay line) 112 and a phase-detector 114. The digital delay line 112 can be configured as a plurality of capacitive delay elements that are each coupled to a delay line and are controlled by a respective one of the L bits of the digital output signal $D_{OUT}$ to provide an incremental amount of delay on the delay line with respect to a reference clock signal $\Phi_{REF}$. Thus, the digital delay line 112 can be configured to generate a phase-delay reference clock signal $\Phi_{DDL}$ that is a phase-delayed version of the reference clock signal $\Phi_{REF}$ by a phase-delay that is set based on the digital value of the digital output signal $D_{OUT}$.

Figure 5:
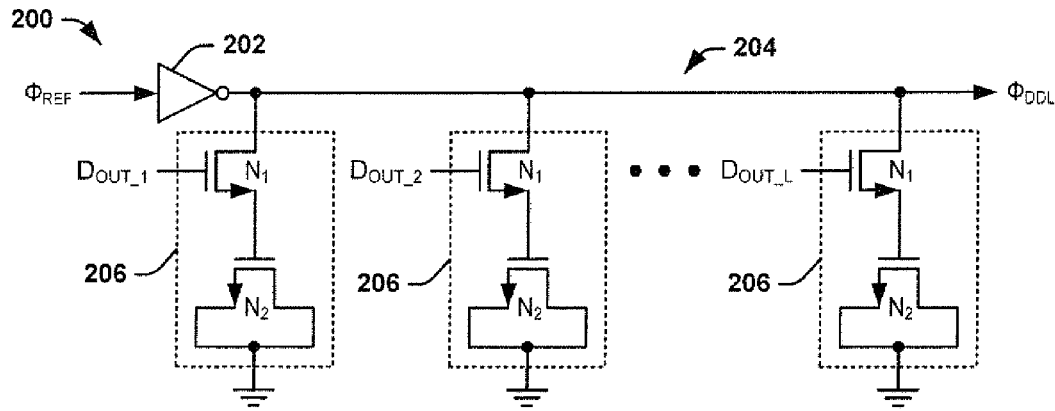
FIG. 5 illustrates an example of a digital delay line system.

FIG. 5 illustrates an example of a digital delay line system 200. The digital delay line system 200 can correspond to the digital delay line 112 in the example of FIG. 3. Therefore, reference is to be made to the example of FIG. 3 in the following description of the example of FIG. 5. The digital delay line system 200 includes an inverter 202 that receives the reference clock signal $\Phi_{REF}$ as an input and provides the phase-shifted reference clock signal $\Phi_{DDL}$ as an output on a delay line 204.

The digital delay line system 200 includes a plurality of delay elements 206 that are coupled to the delay line 204. The delay elements 206 can be configured as digitally-controlled capacitive delay elements. In the example of FIG. 5, the delay elements 206 include a first transistor (e.g., an N-type metal-oxide semiconductor field effect transistor (MOSFET)) $N_1$ interconnecting the delay line 204 and a gate of a second transistor $N_2$. The gate of the first transistor $N_1$ is provided a respective one of a plurality L of digital activation signals $D_{OUT\_1}$ through $D_{OUT\_L}$, where L is a positive integer. As an example, the digital activation signals $D_{OUT\_1}$ through $D_{OUT\_L}$ can each correspond to a bit of the digital output signal $D_{OUT}$, such that the digital activation signals $D_{OUT\_1}$ through $D_{OUT\_L}$ can collectively correspond to the digital output signal $D_{OUT}$. The second transistor $N_2$ has a drain and source that are both coupled to a low-voltage rail (e.g., ground). Therefore, in response to activation of the first transistor $N_1$ in a given one of the delay elements 206, the respective delay element 206 can add an amount of parasitic capacitance corresponding to the first and second transistors $N_1$ and $N_2$ to the delay line 204. As an example, the transistors of the delay elements 206 can have binary incrementally increasing size, such as corresponding to a bit-significance in the digital output signal $D_{OUT}$. Accordingly, the delay elements 206 can add a phase-delay to the reference clock signal $\Phi_{REF}$ in generating the phase-delay reference clock signal $\Phi_{DDL}$ based on the amount of added capacitance. For example, the amount of phase-delay of the phase-delay clock signal $\Phi_{DDL}$ relative to the reference clock signal $\Phi_{REF}$ can be expressed as follows:

$$\Phi_{DDL} - \Phi_{REF} = \Delta\Phi_{DDL} * \alpha * R * (C_{INV} + \Sigma_i^L Ci * D_{OUT\_i}) \qquad \text{Equation 3}$$

Where: R is a channel resistance of the transistors $N_1$ and $N_2$;
$\alpha$ is a gain constant; and
i corresponds to a specific one of the bits of the digital output signal $D_{OUT}$, and thus a specific one of the delay elements 206.

It is to be understood that other arrangements of transistors and/or capacitive elements can be implemented to provide capacitance, and thus delay, to the delay line 204 in the digital delay line system 200. For example, the transistors $N_1$ and $N_2$ could be arranged as different types or polarities of transistors. As another example, the digital delay line system 200 could include capacitor elements. Accordingly, the digital delay line system 200 could be implemented in a variety of different ways.

Referring back to the example of FIG. 3, the phase-delay reference clock signal $\Phi_{DDL}$ and the reference clock signal $\Phi_{REF}$ are provided as inputs to the phase-detector 114. The phase-detector 114 is configured to calculate a phase-difference between the phase-delayed reference clock signal $\Phi_{DDL}$ and the reference clock signal $\Phi_{REF}$. The phase-detector 114 is thus configured to generate the feedback voltage $V_{FB}$ having a magnitude corresponding to the phase-difference between the phase-delayed reference clock signal $\Phi_{DDL}$ and the reference clock signal $\Phi_{REF}$. The feedback voltage $V_{FB}$ can thus be integrated with the input voltage $V_{IN}$ to substantially reduce quantization error and jitter associated with the input clock signal $\Phi_{IN}$ and/or the reference clock signal $\Phi_{REF}$.

Figure 6:
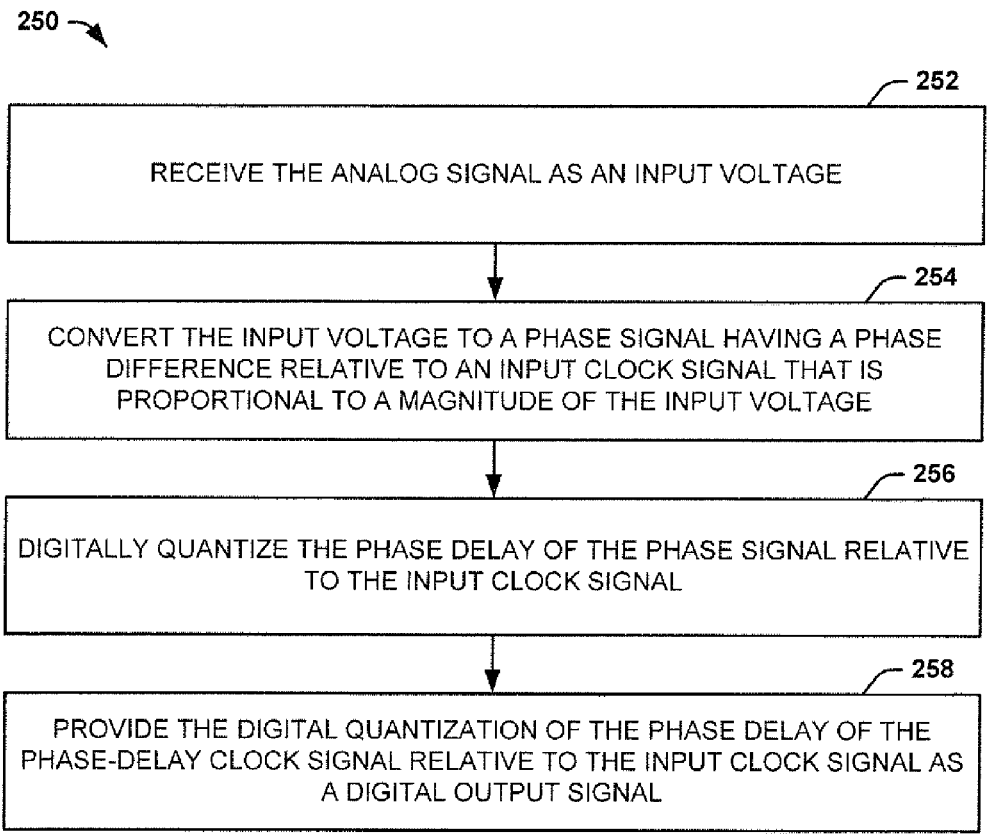
FIG. 6 illustrates an example of a method for converting an analog signal to a digital signal.

In view of the foregoing structural and functional features described above, a methodology in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 6 illustrates an example of a method 250 for converting an analog signal to a digital signal. At 252, the analog signal is received as an input voltage (e.g., the input voltage $V_{IN}$). At 254, the input voltage is converted to a phase signal (e.g., the phase-delay clock signal $\Phi_{DLY}$ or the phase-delay signals $\Phi_{DLY\_1}$ through $\Phi_{DLY\_N}$) having a phase shift relative to an input clock signal (e.g., the input clock signal $\Phi_{IN}$), which phase shift is proportional to a magnitude of the input voltage. At 256, the phase delay of the phase signal is quantized digitally relative to the input clock signal. At 258, the quantization of the phase delay of the phase-delay clock signal relative to the input clock signal is provided as a digital output signal (e.g., the digital output signal $D_{OUT}$).

In view of the foregoing, it will be appreciated that the phase-based ADC disclosed herein can achieve a high signal to noise and distortion ratio (SNDR). As an example, with a 10 MHz input bandwidth and a sampling rate of 640 MHz, the DLL-phase-based ADC model can achieve about 49.9 dB SNDR or 7.99 bits ENOB (effective number of bits). In addition to quantization noise shaping, the approach can implement a $3^{rd}$ order (or higher) noise shaping to the reference clock jitter of the phase quantizer, thereby achieving a higher degree of linearity. Since the ADC architecture is predominantly digital, it lends itself to low power nano-scale devices. For example, the ADC is useful in a variety of technologies, such as wireless communication systems (e.g., software defined radios) or biomedical integrated circuit chips (e.g., for implantable devices).

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A phase-based analog-to-digital converter (ADC) system comprising:
   a voltage-to-phase converter configured to convert an input voltage to a phase signal corresponding to a phase difference with respect to an input clock signal and that is based on a magnitude of the input voltage; and
   a phase-to-digital converter configured to convert the phase signal into a digital output signal having a digital value based on the phase difference.

2. The system of claim 1, further comprising a loop filter configured to filter the input voltage to generate a control voltage, the phase-to-digital converter being configured to convert the control voltage to the phase signal.

3. The system of claim 1, wherein the voltage-to-phase converter comprises a voltage-controlled delay line comprising a plurality of delay elements and being configured to generate a phase-delay clock signal with respect to the input clock signal, the phase-delay clock signal having a phase-delay with respect to the input clock signal that is proportional to a magnitude of the input voltage.

4. The system of claim 3, wherein the voltage-to-phase converter further comprises a phase-detector configured to generate the phase signal as a signal pulse based on a phase-delay between the phase-delay clock signal and the input clock signal, and
   wherein the phase-to-digital converter further comprises a flip-flop that is triggered by a reference clock signal to generate the digital output signal as a single-bit digital data stream corresponding to a time-based quantization of the signal pulse corresponding to the phase difference.

5. The system of claim 3, wherein the voltage-controlled delay line is configured as a plurality of series-connected inverters, wherein a last of the plurality of series-connected inverters generates the phase-delay clock signal, each of the plurality of series-connected inverters being powered by the input voltage.

6. The system of claim 5, wherein the phase difference corresponds to a phase difference signal that is output from each of the plurality of series-connected inverters, wherein the phase-to-digital converter comprises:
   a plurality of flip-flops that are each triggered by the phase-delay clock signal to generate a respective digital data stream corresponding to a magnitude of the phase difference signal that is output from a respective one of the plurality of series-connected inverters; and
   a decoder configured to generate the digital output signal as a multi-bit digital signal based on the respective digital data stream of each of the plurality of flip-flops.

7. The system of claim 1, wherein the phase-based ADC system is configured as a phase-based delta-sigma modulation ADC system, the phase-based delta-sigma modulation ADC system further comprising a feedback path configured to convert the digital output signal to a feedback voltage that is added to the input voltage to generate a summation voltage, the voltage-to-phase converter being configured to convert the summation voltage to the phase signal.

8. The system of claim 7, wherein the feedback path is configured as a charge pump feedback element configured to provide incremental integration of the input voltage in response to the feedback voltage and to generate the summation voltage based on the digital output signal being provided as a single-bit digital data stream.

9. The system of claim 7, wherein the feedback path comprises:

a digital delay line configured to generate a reference phase-delay signal that is phase-delayed with respect to a reference clock signal based on a digital magnitude of the digital output signal; and a phase-detector configured to generate the feedback voltage having a magnitude that is based on the relative phase of the reference phase-delay signal and the reference clock signal.

10. The system of claim 9, wherein the digital delay line comprises:
   a delay line associated with an inverted version of the reference clock signal; and
   a plurality of capacitive delay elements associated with a respective plurality of bits of the digital output signal, each of the plurality of capacitive delay elements being coupled to the delay line and being configured to contribute a respective amount of delay to the reference clock signal based on a respective digital value of one of the plurality of bits of the digital output signal.

11. A method for converting an analog signal to a digital signal, the method comprising:
   receiving the analog signal as an input voltage;
   converting the input voltage to a phase signal having a phase delay relative to an input clock signal that is proportional to a magnitude of the input voltage;
   digitally quantizing the phase delay of the phase signal relative to the input clock signal; and
   providing a digital output signal based on the digital quantization of the phase delay of the phase signal relative to the input clock signal.

12. The method of claim 11, wherein converting the input voltage to the phase signal comprises:
   providing the input clock signal to a plurality of series-connected inverters, wherein a last of the plurality of series-connected inverters generates the phase signal; and
   powering each of the plurality of series-connected inverters with the input voltage.

13. The method of claim 12, wherein converting the input voltage to the phase signal further comprises generating a signal pulse corresponding to a phase-delay between the phase signal and the input clock signal,
   wherein digitally quantizing the phase delay comprises providing the signal pulse to a flip-flop that is triggered via a reference clock signal, and
   wherein providing the digital quantization comprises generating the digital output signal as a single-bit digital data stream from the flip-flop as a time-based quantization of the signal pulse.

14. The method of claim 12, wherein digitally quantizing the phase delay comprises:
   providing an output of each of the plurality of series-connected inverters to a one of a respective plurality of flip-flops; and
   triggering each of the plurality of flip-flops with the phase signal to generate a respective digital data stream corresponding to a magnitude of phase-delay of the input clock signal that is output from the respective one of the plurality of series-connected inverters.

15. The method of claim 11, further comprising:
   providing the digital output signal to a feedback path to generate a feedback voltage having a magnitude that is associated with a value of the digital output signal; and
   adding the feedback voltage to the input voltage to generate a summation voltage, wherein converting the input voltage to the phase signal comprises converting the summation voltage to the phase signal having the phase delay relative to the input clock signal that is proportional to a magnitude of the summation voltage.

16. The method of claim 15, wherein providing the digital output signal to the feedback path comprises providing the digital output signal to a charge pump feedback element configured to provide incremental integration of the input voltage in response to the feedback voltage to generate the summation voltage.

17. The method of claim 15, wherein providing the digital output signal to the feedback path comprises:
   generating a reference phase-delay signal that is phase-delayed with respect to a reference clock signal based on a digital magnitude of the digital output signal; and
   generating the feedback voltage as having a magnitude that is based on the phase-delay of the reference phase-delay signal relative to the reference clock signal.

18. A phase-based delta-sigma modulation analog-to-digital converter (ADC) system that is configured to convert an input voltage to a digital output signal, the system comprising:
   a loop filter configured to filter a summation voltage to generate a control voltage;
   a voltage-to-phase converter configured to convert the control voltage to a phase signal corresponding to a phase difference with respect to an input clock signal that is based on a magnitude of the summation voltage;
   a phase-to-digital converter configured to convert the phase signal into the digital output signal having a digital value corresponding to a magnitude of the phase difference; and
   a feedback path configured to convert the digital output signal to a feedback voltage that is integrated with the input voltage to generate the summation voltage.

19. The system of claim 18, wherein the voltage-to-phase converter comprises:
   a voltage-controlled delay line comprising a plurality of delay elements that are each powered by the control voltage and that are each configured to generate a phase-delay clock signal with respect to the input clock signal, each phase-delay clock signal having a phase-delay with respect to the input clock signal that is proportional to a magnitude of the input voltage; and
   a phase-detector configured to generate the phase signal as a signal pulse based on the phase-delay between the phase-delay clock signal and the input clock signal;
   wherein the phase-to-digital converter further comprises a flip-flop that is triggered by a reference clock signal to generate the digital output signal as a single-bit digital data stream corresponding to a time-based quantization of the signal pulse corresponding to a value of the phase signal.

20. The system of claim 18,
   wherein the voltage-to-phase converter comprises a voltage-controlled delay line comprising a plurality of series-connected delay elements that are each powered by the control voltage, each of the plurality of series-connected delay elements being configured to generate a phase-difference signal, wherein a last of the plurality of series-connected delay elements generates a phase-delay clock signal;
   wherein the phase-to-digital converter comprises:
      a plurality of flip-flops that are each triggered by the phase signal to generate a respective digital data stream corresponding to a magnitude of the phase-difference signal that is output from a respective one of the plurality of series-connected delay elements; and a decoder configured to generate the digital output signal as a multi-bit digital signal based on the respective digital data stream of each of the plurality of flip-flops.

* * * * *